(12) United States Patent
Fukumori (10) Patent No.: US 9,067,151 B2
(45) Date of Patent: Jun. 30, 2015

(54) TRAP APPARATUS AND SUBSTRATE PROCESSING APPARATUS

(75) Inventor: Koji Fukumori, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 91 days.

(21) Appl. No.: 13/637,426

(22) PCT Filed: Jun. 20, 2011

(86) PCT No.: PCT/JP2011/064093
§ 371 (c)(1),
(2), (4) Date: Sep. 26, 2012

(87) PCT Pub. No.: WO2012/002191
PCT Pub. Date: Jan. 5, 2012

(65) Prior Publication Data
US 2013/0008381 A1    Jan. 10, 2013

(30) Foreign Application Priority Data
Jun. 29, 2010    (JP) ................................ 2010-148013

(51) Int. Cl.
*C23C 16/00*    (2006.01)
*B01D 8/00*    (2006.01)
*C23C 16/44*   (2006.01)

(52) U.S. Cl.
CPC ............ *B01D 8/00* (2013.01); *Y10T 137/6416* (2015.04); *C23C 16/4412* (2013.01)

(58) Field of Classification Search
CPC ............ C23C 16/4412; C23C 16/4401; C23C 16/45587; B01D 8/00; B01D 2258/0216; H01J 37/32788; H01J 37/32834; H01J 37/32844; H01J 37/32871

USPC .................... 118/715; 55/385.2; 95/288, 290
See application file for complete search history.

(56) References Cited

U.S. PATENT DOCUMENTS

| | | | | |
|---|---|---|---|---|
| 6,051,053 | A * | 4/2000 | Noji et al. ........................ | 95/133 |
| 6,517,592 | B2 * | 2/2003 | Umotoy et al. ............. | 55/315.2 |
| 6,966,936 | B2 * | 11/2005 | Yamasaki et al. ............ | 55/385.2 |
| 7,918,910 | B2 * | 4/2011 | Ahn et al. ..................... | 55/385.1 |
| 2003/0141016 | A1 * | 7/2003 | Okase et al. ............. | 156/345.29 |
| 2006/0174611 | A1 * | 8/2006 | Dilley et al. .................... | 60/320 |

(Continued)

FOREIGN PATENT DOCUMENTS

| | | |
|---|---|---|
| JP | 5-132759 | 5/1993 |
| JP | 2000-070664 | 3/2000 |
| JP | 2001-262349 | 9/2001 |

*Primary Examiner* — Gordon R Baldwin
*Assistant Examiner* — Charlee Bennett
(74) *Attorney, Agent, or Firm* — IPUSA, PLLC (57) ABSTRACT

A trap apparatus provided between a chamber and an evacuating unit, includes an inlet port and an exhausting port to be respectively connected to the chamber and the evacuating unit; a cooling trap portion provided with a first space for cooling gas in the first space; and a bypass portion provided with a first channel capable of communicating between the inlet port and the first space, a second channel capable of communicating between the first space and the exhausting port, and a second space capable of communicating between the inlet port and the exhausting port, the bypass portion being relatively movable with respect to the cooling trap portion to selectively form a first path from the inlet port to the exhausting port via the first channel, the first space and the second channel, and a second path from the inlet port to the exhausting port via the second space.

12 Claims, 11 Drawing Sheets

(56) References Cited

U.S. PATENT DOCUMENTS

2009/0202831 A1* 8/2009 Honda et al. ................ 428/383
2009/0306808 A1* 12/2009 Cho et al. ..................... 700/121
2010/0012292 A1* 1/2010 Yamazaki ..................... 165/61

* cited by examiner

TRAP APPARATUS AND SUBSTRATE PROCESSING APPARATUS

TECHNICAL FIELD

The present invention relates to a trap apparatus and a substrate processing apparatus.

BACKGROUND ART

Polyimide is used as one of insulating materials in a semiconductor device. Polyimide is used for an interlayer dielectric film, a passivation film or the like as polyimide has high adhesive properties and can lower a leak current. Such polyimide is especially considered to be favorable as an insulating film in a three-dimensional packaging where a semiconductor chip is stacked in order to increase integration degree of a semiconductor device.

As one of methods of forming such a polyimide film, Vapor Deposition Polymerization (Vapor Deposition Copolymerization) in which Pyromellitic dianhydride (PMDA) and 4,4'-Oxydianiline (ODA) are used as source monomers is known.

In the Vapor Deposition Polymerization, PMDA and ODA, which are low molecular monomers with high reactivity, are co-vaporized on a surface of a substrate provided in a chamber and copolymerized on the surface of the substrate to obtain polyimide, which is giant molecule polymer.

Specifically, the Vapor Deposition Polymerization is as follows.

PMDA+ODA→polyamic acid (PAA)→polyimide (PI)+H$_2$O

In a substrate processing apparatus which performs film deposition by the Vapor Deposition Polymerization, source monomers which do not contribute to the Vapor Deposition Polymerization on the substrate are exhausted in a form of monomers without contributing to the film deposition of a polyimide film to reach inside a vacuum pump which evacuates a chamber of the substrate processing apparatus. It is known that temperatures of such source monomers are lowered until the source monomers reach the vacuum pump so that the source monomers are changed from gasses to a state of solid or the like and fixed or the like in the vacuum pump to cause a trouble of the vacuum pump. Thus, it is necessary to remove these source monomers before these source monomers reach inside the vacuum pump. As such an apparatus, a vacuum polymerization apparatus which includes a monomer trap including a water cooling coil is disclosed (Patent Document 1, for example).

Further, in a general vacuum film deposition apparatus where vaporized materials of polymer are not used as source materials, a removing apparatus is provided between a chamber and a vacuum pump in order to prevent evacuated unreacted components from introducing into the vacuum pump as contaminants. As one kind of such removing apparatuses, a removing apparatus in which unreacted components are reacted in the removing apparatus to be adhered on an inside wall so that the unreacted components are removed is disclosed (Patent Document 2, for example).

On the other hand, a substrate processing apparatus having a function to capture a gas component using a trap where one end of the trap is connected to an end of an expansion pipe, and is capable of changing over between a capturing mode and a non-capturing mode by extending and shrinking the expansion pipe is disclosed (Patent Document 3, for example).

RELATED ART

Patent Document

[Patent Document 1] Japanese Laid-open Patent Publication No. H05-132759
[Patent Document 2] Japanese Laid-open Patent Publication No. 2000-070664
[Patent Document 3] Japanese Laid-open Patent Publication No. 2001-262349

SUMMARY OF THE INVENTION

Problems to be Solved by the Invention

The present invention provides a trap apparatus and a substrate processing apparatus suitable for removing monomers such as PMDA, ODA or the like.

Means to Solve the Problems

According to an embodiment, there is provided a trap apparatus provided between a chamber to which a gas supply unit for introducing gas to process a substrate is connected and an evacuating unit for evacuating the gas in the chamber, including an inlet port to be connected to the chamber; an exhausting port to be connected to the evacuating unit; a cooling trap portion provided with a first space and configured to cool gas introduced into the first space to be a temperature lower than a temperature at which an unreacted component included in the gas is solidified; and a bypass portion provided with a first channel capable of communicating between the inlet port and the first space, a second channel capable of communicating between the first space and the exhausting port, and a second space capable of communicating between the inlet port and the exhausting port, the bypass portion being relatively movable with respect to the cooling trap portion to selectively form a first path from the inlet port to the exhausting port via the first channel, the first space and the second channel, and a second path from the inlet port to the exhausting port via the second space.

EMBODIMENTS

According to the embodiments, a trap apparatus and a substrate processing apparatus suitable for removing monomers such as PMDA, ODA or the like are provided. Embodiments of the present invention will be described below in detail.

First Embodiment

The embodiment relates to a film deposition apparatus in which PMDA and ODA are used as source monomers to obtain polyimide by the Vapor Deposition Polymerization, which is a substrate processing apparatus, and a trap apparatus which is incorporated in the substrate processing apparatus.

Figure 1:
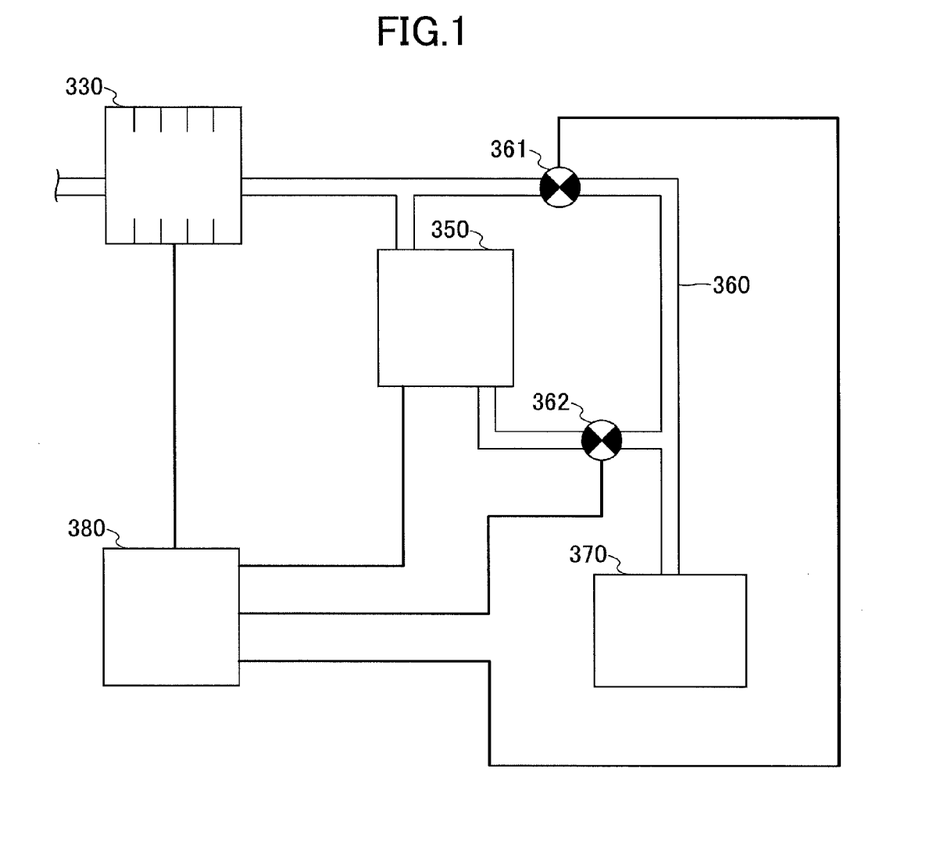
FIG. 1 is a view for explaining an evacuating system including a trap apparatus.

First, with reference to FIG. 1, trap apparatuses for gasses evacuated from a chamber when PMDA and ODA are used as source monomers are explained.

As shown in FIG. 1, in a substrate processing apparatus where PMDA and ODA are used as source monomers, gasses evacuated from a chamber, not shown in the drawings, are evacuated by a vacuum pump 370 via a first trap apparatus 330 and a second trap apparatus 350. The first trap 330 removes vaporized PMDA and ODA by generating polyimide by reacting the vaporized PMDA and ODA by a Vapor Deposition Polymerization, and depositing the generated polyimide on a wall surface or the like in the first trap 330. The second trap 350 cools inside the second trap 350 to a low temperature so that PMDA and ODA are solidified to be in a form of powder, and removes the generated PMDA and ODA by a method of gravity settling or the like. When the chamber (not shown in the drawings) at an atmospheric pressure is evacuated via the second trap 350, which removes the generated PMDA and ODA in a form of powder, by the method of gravity settling or the like, conductance becomes lower. Thus, a period necessary for evacuating the chamber to become a predetermined targeted degree of vacuum becomes very long. Further, there may be a case that the PMDA and ODA in a form of powder deposited on a bottom surface of the second trap 350 by the gravity settling or the like are blown up.

Thus, it can be considered to provide a bypass line 360, and a first valve 361 and a second valve 362 upstream and downstream of the second trap 350, in other words, upstream and downstream of the bypass line 360, respectively, and to control open and close of the first valve 361 and the second valve 362 in order to evacuate the chamber by the vacuum pump 370 without passing through the second trap 350. The first valve 361, the second valve 362, the first trap 330, and the second trap 350 are connected to a controller 380, which is a control unit, and are controlled respectively.

In this structure, the chamber, not shown in the drawings, is evacuated by the vacuum pump 370 under a state where the first valve 361 is opened and the second valve 362 is closed. With this, gasses evacuated from the chamber flow through the first trap 330, the first valve 361, and the bypass line 360 and are evacuated by the vacuum pump 370.

Further, when the vaporized PMDA and ODA are supplied into the chamber to form polyimide, the first valve 361 is closed and the second valve 362 is opened. With this, the gasses evacuated from the chamber flow through the first trap 330, the second trap 350, and the second valve 361 and are evacuated by the vacuum pump 370. At this time, as the inside of the second trap 350 is cooled, the PMDA and ODA in a vaporized state are solidified, and the solidified PMDA and ODA are removed by the gravity settling or the like.

However, with this method, the first valve 361 and the second valve 362, and further the bypass line 360, are necessary. Thus, it is difficult to downsize the substrate processing apparatus and the trap apparatus to increase cost.

The present invention is made in light of the above.

(Film Deposition Apparatus)

Figure 2:
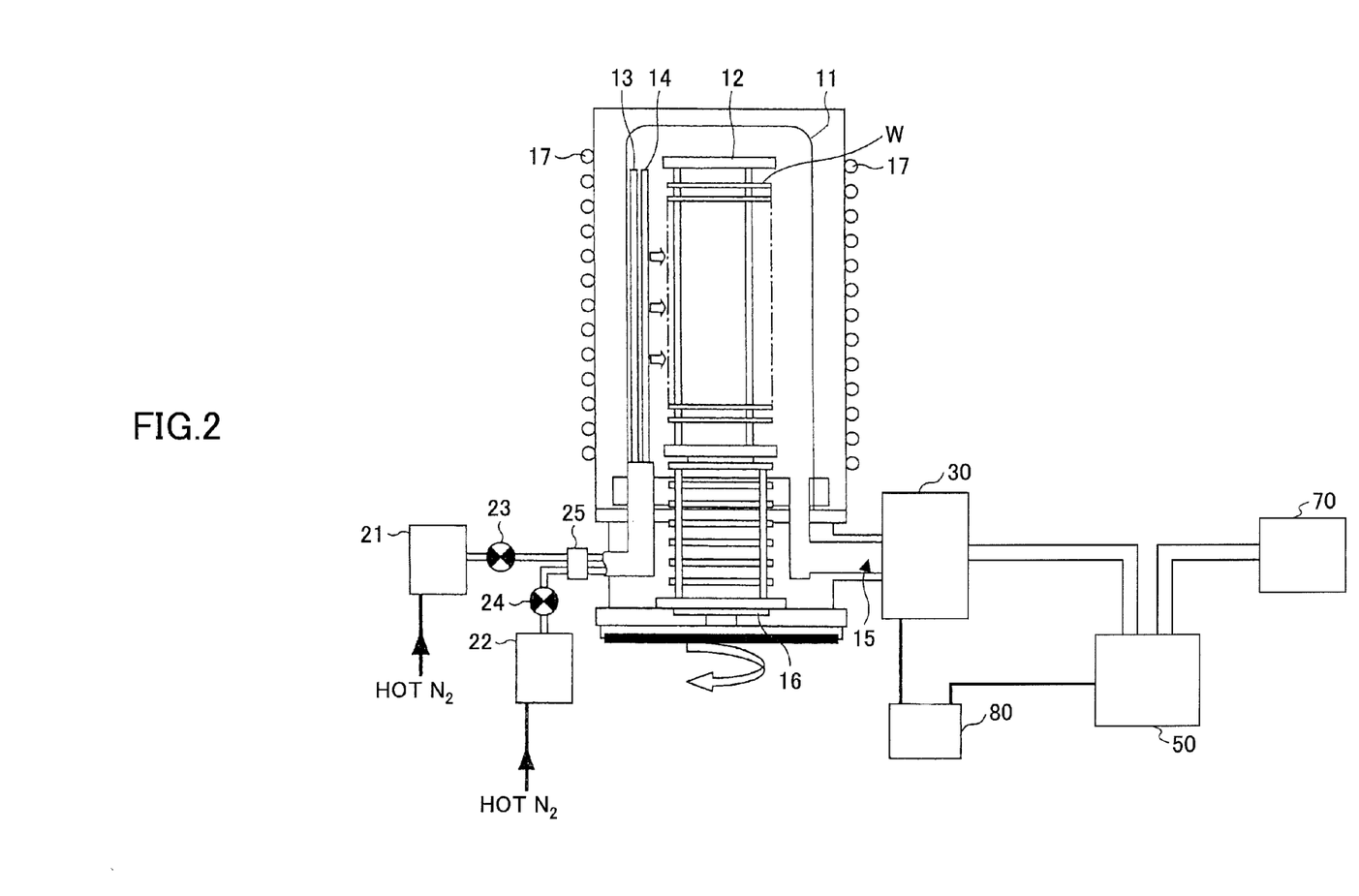
FIG. 2 is a view showing a structure of a substrate processing apparatus of a first embodiment.
Figure 3:
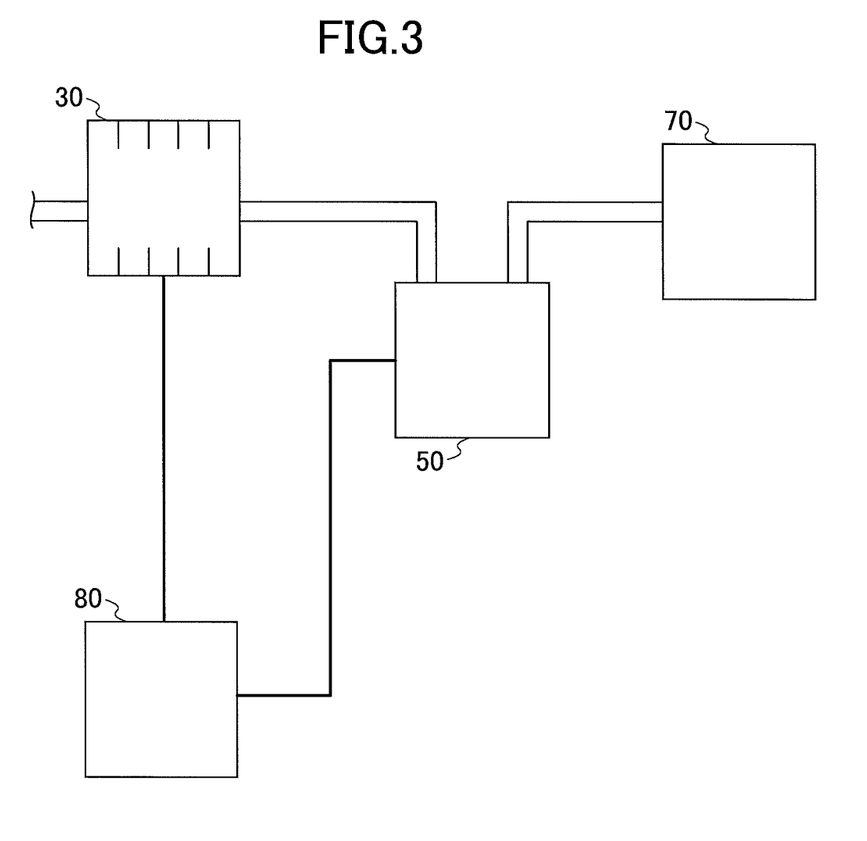
FIG. 3 is a view showing a structure of an evacuating system including a trap apparatus of the first embodiment.

The trap apparatus and the substrate processing apparatus of the embodiment are explained with reference to FIG. 2 and FIG. 3. FIG. 2 shows the substrate processing apparatus of the embodiment and FIG. 3 shows an evacuating system of the substrate processing apparatus of the embodiment, in other words, the evacuating system including the trap apparatus of the embodiment.

The substrate processing apparatus of the embodiment includes a wafer boat 12 capable of placing plural wafers W, on which polyimide films are to be formed, in a chamber 11 which is capable of being evacuated by a vacuum pump 70. The substrate processing apparatus further includes injectors 13 and 14 for respectively supplying vaporized PMDA and ODA in the chamber 11. The injectors 13 and 14 are provided with opening portions at side surfaces, and the vaporized PMDA and ODA are supplied to the wafers W from a horizontal direction as shown by arrows in FIG. 2 from the injectors 13 and 14, respectively. The supplied vaporized PMDA and ODA are formed to be polyimide by Vapor Deposition Polymerization on the wafers W. The vaporized PMDA and ODA which do not contribute to deposition of polyimide films flow as they are and exhausted to outside the chamber 11 from an exhausting port 15. Further, the wafer boat 12 is configured to be rotated by a rotational portion 16 in order to uniformly deposit the polyimide films on the respective wafers W. Further, a heater 17 is provided at outside of the chamber 11 for heating the wafers W in the chamber 11 to a constant temperature.

The injectors 13 and 14 are connected to a PMDA vaporizer 21 and an ODA vaporizer 22 via valves 23 and 24, respectively. Further, an introducing unit 25 is provided between the valves 23 and 24 which are respectively connected to the PMDA vaporizer 21 and the ODA vaporizer 22, and the injectors 13 and 14. With this structure, the vaporized PMDA and ODA vaporized by the PMDA vaporizer 21 and the ODA vaporizer 22 are supplied from the injectors 13 and 14, respectively.

Nitrogen gas at high temperature is supplied to the PMDA vaporizer 21 as carrier gas to sublime PMDA in the PMDA vaporizer 21 and to supply the PMDA in a vaporized state. Thus, the PMDA vaporizer 21 is maintained at a temperature of 260° C. Nitrogen gas at high temperature is supplied to the ODA vaporizer 22 as carrier gas and ODA which is heated to a high temperature and becomes liquid is bubbled by the supplied nitrogen gas so that the ODA is supplied in a vaporized state as vapor included in the nitrogen gas. Thus, the ODA vaporizer 22 is maintained at a temperature of 220° C. Subsequently, the vaporized PMDA and ODA are supplied into the injectors 13 and 14 via the valves 23 and 24 and become polyimide on a surface of each of the wafers W provided in the chamber 11. When depositing polyimide, the temperature inside the chamber 11 is maintained at 200° C.

Thus, in the film deposition apparatus of the embodiment, the vaporized PMDA and the vaporized ODA are ejected in a lateral direction by the injectors 13 and 14 and polymerized on the wafers W to form the polyimide films.

Further, in this embodiment, when the chamber 11 is evacuated, gasses flow from the exhausting port 15 to a first trap 30 and a second trap 50, and are evacuated by the vacuum pump 70. Further, connecting valves may be provided between the first trap 30 and the second trap 50, and between the second trap 50 and the vacuum pump 70 in accordance with necessity.

Further, temperature controllers, not shown in the drawings, by heaters or the like are provided to the first trap 30 and the second trap 50, respectively, and the temperatures are controlled by the controller 80 such that the first trap 30 and the second trap 50 become predetermined temperatures, respectively.

(First Trap)

Figure 4:
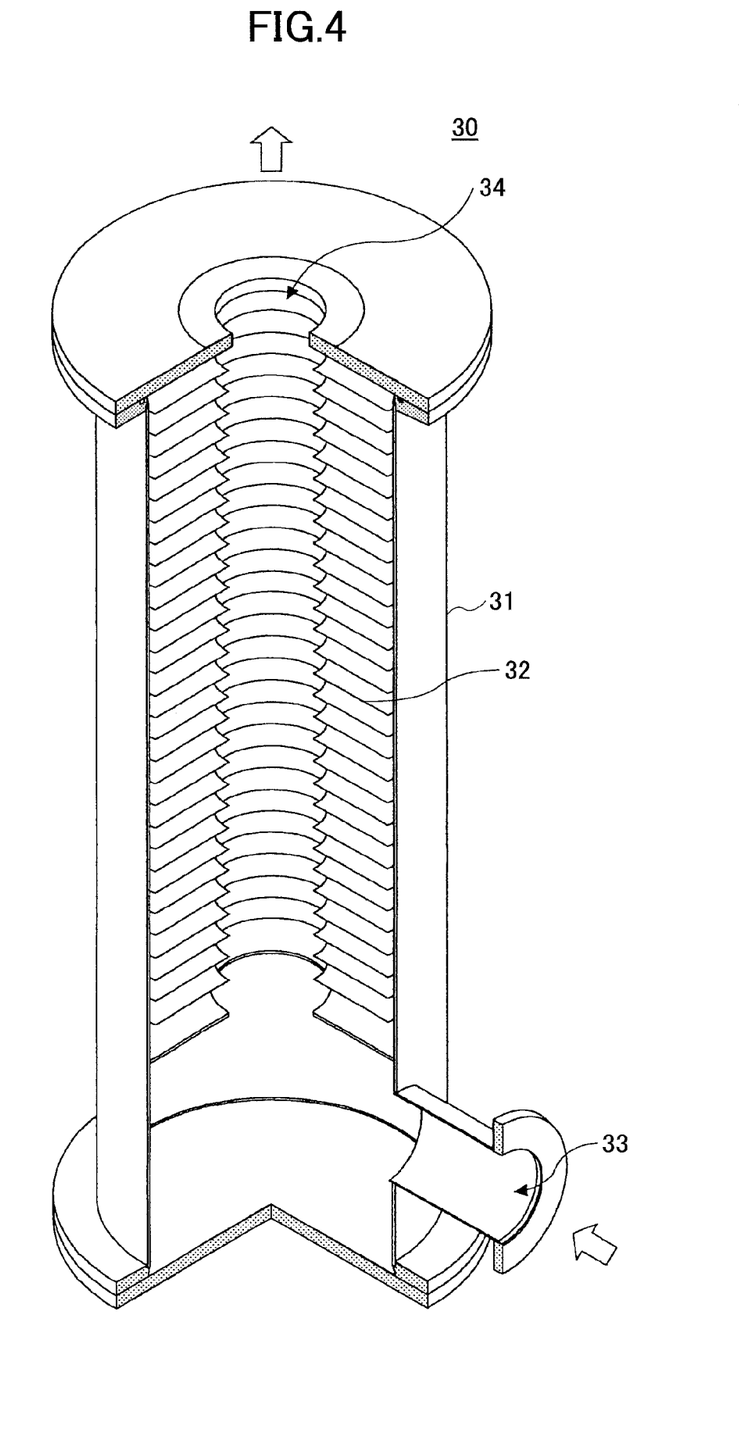
FIG. 4 is a view for explaining a first trap.

Next, the first trap 30 is explained. FIG. 4 shows the first trap 30. The first trap 30 includes a cylindrical housing portion 31, and plural disciform fins 32 are provided inside the housing portion 31. An inlet portion 33 of the first trap 30 is connected to the exhausting port 15 of the chamber 11, and evacuated gasses are introduced into the first trap 30 from the inlet portion 33 by an evacuation by the vacuum pump 70 via the second trap 50. The first trap 30 is maintained at 140 to 200° C. by a controller 80, and thus, the plural fins 32 provided inside the first trap 30 are maintained at this temperature. At this temperature, the vaporized PMDA and ODA react and polyimide is formed. Thus, the PMDA and ODA flowed from the chamber 11 into the first trap 30 react and polyimide films are formed on surfaces of the fins 32. With this, the PMDA and ODA can be removed from the evacuated gasses as much as possible by the Vapor Deposition Polymerization of the PMDA and ODA in a vaporized state. Subsequently, the gasses are evacuated from an exhausting port 34.

In the first trap 30 of the embodiment, the fins 32 are provided in a multiple stage to be substantially perpendicular to an evacuating channel in the housing portion 31. In other words, the evacuating channel is formed by opening portions of the fins 32 provided in a multiple stage. By providing the fins 32 as a multiple stage, the PMDA and ODA included in the evacuated gasses efficiently react to deposit polyimide on surfaces of the fins 32 to remove the PMDA and ODA. Thus, the PMDA and ODA in a form of gasses within the evacuated gasses can be efficiently removed. Thus, the first trap 30 is maintained at 140 to 200° C.

For example, for the first trap 30 of the embodiment, the height of the housing portion 31 is about 1000 mm, and the inner diameter of the housing portion 31 is about 310 mm. The outer diameter of each of the fins 32 is about 300 mm, and the inner diameter of each of the fins 32 is about 110 mm. In the housing portion 31, 30 fins 32 are positioned with about 24 mm pitch.

(Second Trap)

Figure 5:
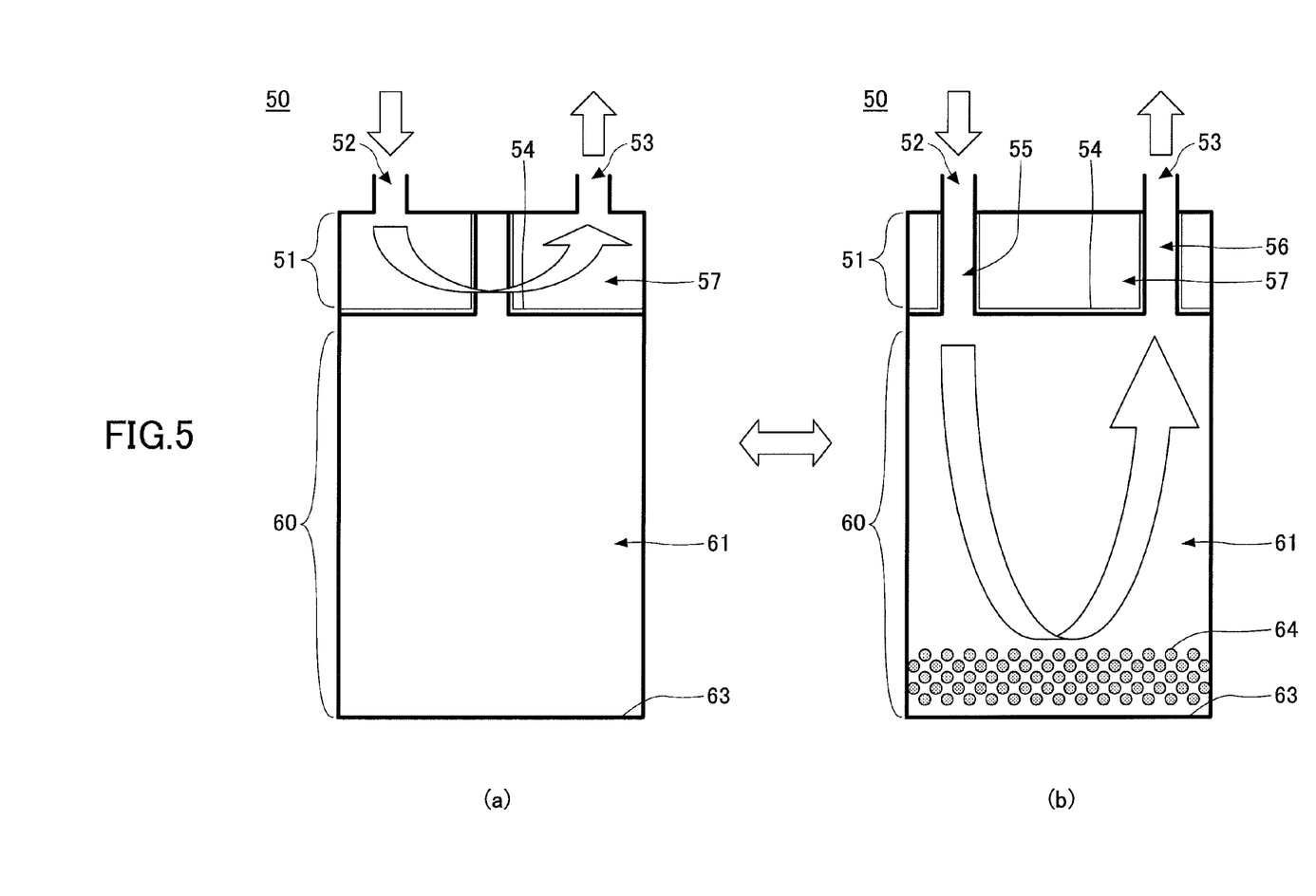
FIG. 5 is a view for explaining a function of the trap apparatus of the first embodiment.
Figure 6:
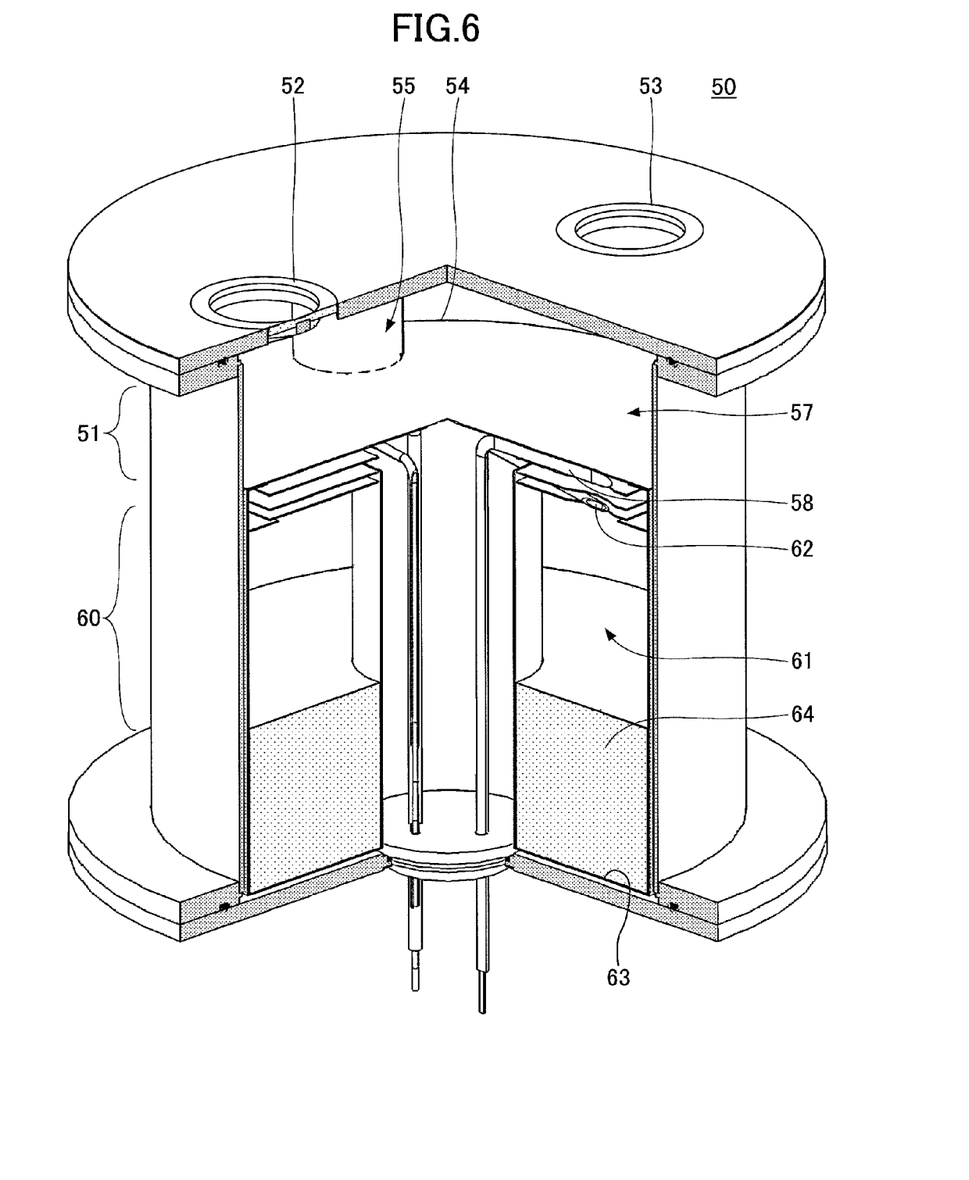
FIG. 6 is a view (1) showing a structure of the trap apparatus of the first embodiment.
Figure 7:
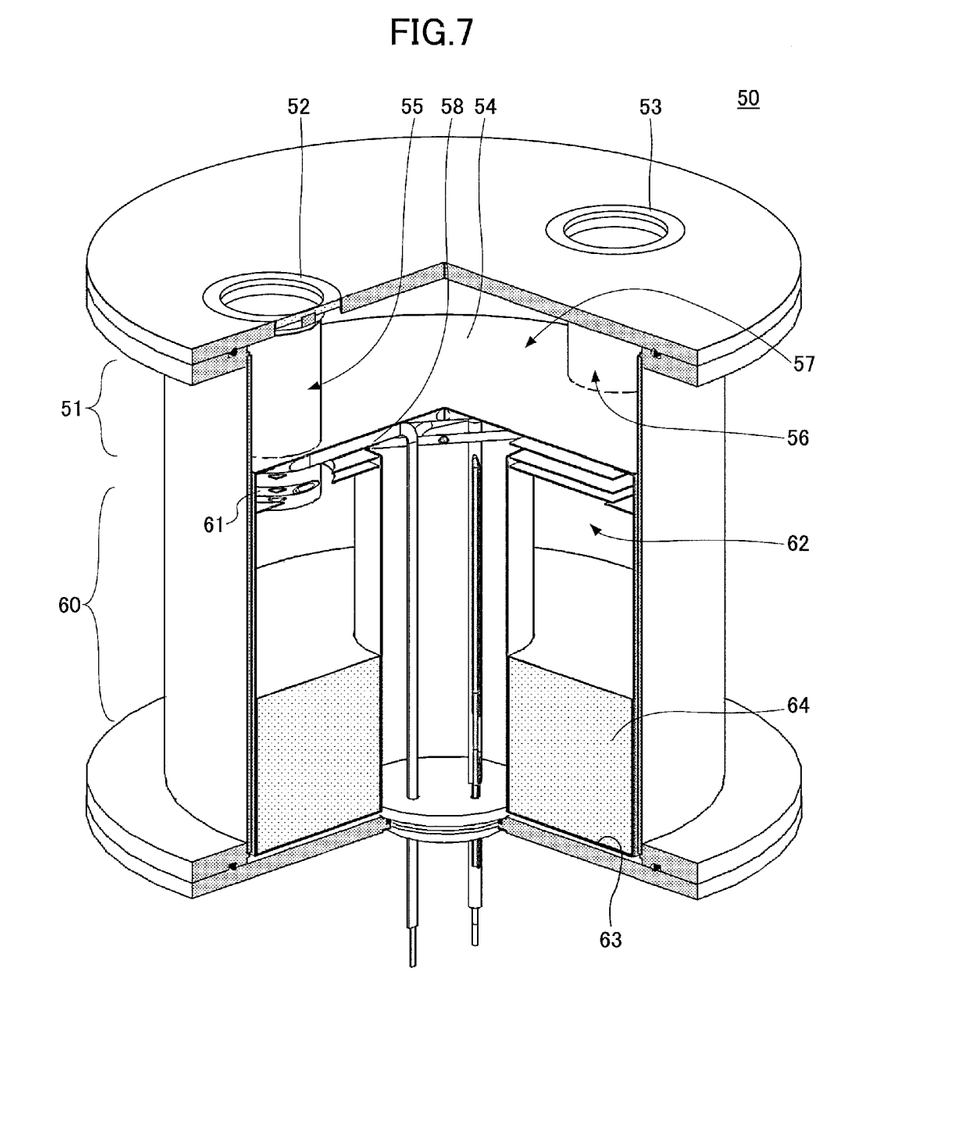
FIG. 7 is a view (2) showing a structure of the trap apparatus of the first embodiment.

The second trap 50, which is a trap apparatus of the embodiment, is explained with reference to FIG. 5 to FIG. 7. The second trap 50 is configured to be cylindrical and includes a bypass portion 51 at an upper portion and a cooling trap portion 60 at a lower portion in the cylindrical portion. FIG. 5 is a view for explaining a function of the second trap 50, FIG. 6 is a view showing an inside structure of the second trap 50 which is at a bypass state, and FIG. 7 is a view showing an inside structure of the second trap 50 which is at a trapping state.

An inlet port 52 and an exhausting port 53 are provided at an upper surface of the second trap 50 where the inlet port 52 of the second trap 50 is connected to the exhausting port 34 of the first trap 30, and the exhausting port 53 is connected to the vacuum pump 70.

A rotational portion 54 is provided at the bypass portion 51 at the upper portion of the second trap 50, and a first channel 55 and a second channel 56 for being connected to the cooling trap portion 60 are provided at the rotational portion 54. The bypass portion 51 is provided with a space 57 at an area other than the areas where the first channel 55 and the second channel 56 are provided.

Further, the cooling trap portion 60 is provided with a space 61 which is connected to the inlet port 52 and the exhausting port 53 via the first channel 55 and the second channel 56 when the rotational portion 54 of the bypass portion 51 is rotated.

A heater unit 58 is provided at the bypass portion 51 so that the entirety of the bypass portion 51 is heated, and a cooling unit 62 of water-cooling or the like is provided at the cooling trap portion 60 so that the entirety of the cooling trap portion 60 is cooled.

In the second trap 50, whether to introduce the evacuated gasses into the space 61 in the cooling trap portion 60 is controlled by whether connecting the first channel 55 and the second channel 56 to the inlet port 52 and the exhausting port 53, respectively, by rotating the rotational portion 54 of the bypass portion 51.

Specifically, as shown in (a) of FIG. 5 and FIG. 6, when the first channel 55 and the second channel 56 are not connected to the inlet port 52 and the exhausting port 53, respectively, the gasses flow from the inlet port 52 are introduced into the space 57 in the bypass portion 51, and subsequently, are exhausted from the exhausting port 53. As the bypass portion 51 is heated by the heater unit 58, the vaporized materials included in the gasses introduced into the space 57 in the bypass portion 51 from the inlet port 52 are not solidified and exhausted from the exhausting port 53.

Next, as shown in (b) of FIG. 5 and FIG. 7, when the first channel 55 and the second channel 56 are connected with the inlet port 52 and the exhausting port 53, respectively, by rotating the rotational portion 54 of the bypass portion 51, the gasses flow from the inlet port 52 are introduced into the space 61 in the cooling trap portion 60 via the first channel 55, and subsequently, are exhausted from the exhausting port 53 via the second channel 56. As the entirety of the space 61 in the cooling trap portion 60 is cooled by the cooling unit 62 in the cooling trap portion 60, the vaporized PMDA and ODA included in the gasses introduced into the space 61 can be solidified. The solidified PMDA and ODA fall by gravity to be deposited on a bottom surface portion 63 of the space 61 in the cooling trap portion 60 as deposits 64.

As described above, in the second trap 50, whether to cool the PMDA and ODA in a vaporized state and trap the PMDA and ODA by gravity settling can be controlled by rotating the rotational portion 54 of the bypass portion 51.

For example, when evacuating the chamber 11 at atmospheric pressure, as shown in (a) of FIG. 5 and FIG. 6, the first channel 55 and the second channel 56 are made not to be connected to the inlet port 52 and the exhausting port 53, respectively. At this state, by the evacuation by the vacuum pump 70, the gasses introduced from the inlet port 52 are exhausted from the exhausting port 53 via the space 57 in the bypass portion 51. When the chamber 11 at atmospheric pressure is evacuated, the amount of evacuated gasses are large, however, as the evacuated gasses are not introduced into the space 61 in the cooling trap portion 60, the deposits 64 deposited on the bottom surface portion 63 of the space 61 are not blown up. Thus, the deposits 64 are not mixed into the evacuated gasses so that the deposits 64 are not introduced into the vacuum pump 70.

On the other hand, when polyimide are deposited on the wafers W, as shown in (b) of FIG. 5 and FIG. 7, the first channel 55 and the second channel 56 are connected to the inlet port 52 and the exhausting port 53, respectively. At this state, the vaporized PMDA and ODA for depositing polyimide are introduced into the chamber 11 and are evacuated by the vacuum pump 70. At this case, the evacuated gasses flowing from the inlet port 52 are introduced into the space 61 in the cooling trap portion 60 via the first channel 55 of the bypass portion 51. As described above, as the space 61 in the cooling trap portion 60 is cooled by the cooling unit 62, the PMDA and ODA in a vaporized state included in the evacuated gasses can be solidified and the solidified PMDA and ODA are deposited on the bottom surface portion 63 of the space 61 in the cooling trap portion 60 as the deposits 64. With this operation, the PMDA and ODA in a vaporized state can be removed from the evacuated gasses. Subsequently, the gasses are exhausted from the exhausting port 53 via the second channel 56 from the space 61 in the cooling trap portion 60.

Here, for the trap apparatus of the embodiment, an outside shape does not change at the bypass state shown in (a) of FIG. 5 and FIG. 6 and at the trapping state shown in (b) of FIG. 5 and FIG. 7. Further, as it is not necessary for the trap apparatus of the embodiment to include valves or the like for change over, the trap apparatus can be downsized and reduce cost.

Here, when depositing polyimide, as the amount of the PMDA and ODA in a vaporized state supplied to the chamber 11 is small, the amount of the gasses evacuated by the vacuum pump 70 is extremely small. Thus, even the gasses are introduced into the space 61 in the cooling trap portion 60, the deposits 64 deposited on the bottom surface portion 63 of the space 61 are not blown up. Thus, the deposits 64 are not mixed in the gasses when the gasses are evacuated from the space 61 so that the deposits 64 are not introduced into the vacuum pump 70.

As described above, in the second trap 50, by controlling rotation of the rotational portion 54 of the bypass portion 51, a state where the evacuated gasses are flowed into the space 57 in the bypass portion 51 and are bypassed, and a state where the evacuated gasses are flowed into the space 61 in the cooling trap portion 60 to remove the PMDA and ODA in a vaporized state can be changed over. Thus, the second trap 50, which is the trap apparatus of the embodiment, can be made small with low cost, and capable of changing over a trap function and a bypass function. The change over may be manually performed or may be controlled by the controller 80 or the like.

Further, in this embodiment, as the cooling trap portion 60 of the second trap 50 solidifies the PMDA and ODA in a vaporized state in the evacuated gasses to remove, the cooling trap portion 60 is controlled to be less than or equal to 120° C. by the cooling unit 62 by the controller 80.

Further, the evacuation speed of the vacuum pump 80 is set such that the speed of the gasses flow in the space 62 in the cooling trap portion 60 of the second trap 50 is controlled not to blow up the deposited solidified PMDA and ODA on the bottom surface portion 63 by the rising gasses. Further, in the second trap 50, the gasses are introduced into the space 61 from an upper direction to a lower direction via the first channel 55 from the inlet port 52, and evacuated from the space 62 from a lower direction to an upper direction via the second channel 56 to the exhausting port 53. Thus, the direction of the gasses flowing through the second channel 56 is opposite to gravity, so that the solidified PMDA and ODA can be prevented from being mixed into the evacuated gasses as much as possible.

Further, an ejecting portion (not shown in the drawings) for ejecting the contaminants from the cooling trap portion 60 is provided at an outside wall of the cooling trap portion 60 of the second trap 50. Thus, the PMDA and ODA deposited in the cooling trap portion 60 can be ejected from the contaminants ejecting portion and maintenance or the like can be simply performed.

Further control of rotation by the rotational portion 54, the temperature or flow rate of refrigerant flowing in the cooling unit 62 of the second trap 50, may be controlled by a control program executed by a computer, not shown in the drawings. Further, the control program may be stored in a computer readable storing medium.

Second Embodiment

Next, a second embodiment is explained. This embodiment relates to a trap apparatus having a different structure from that of the trap apparatus of the first embodiment and the trap apparatus may be used as the second trap of the substrate processing apparatus of the first embodiment.

Figure 8:
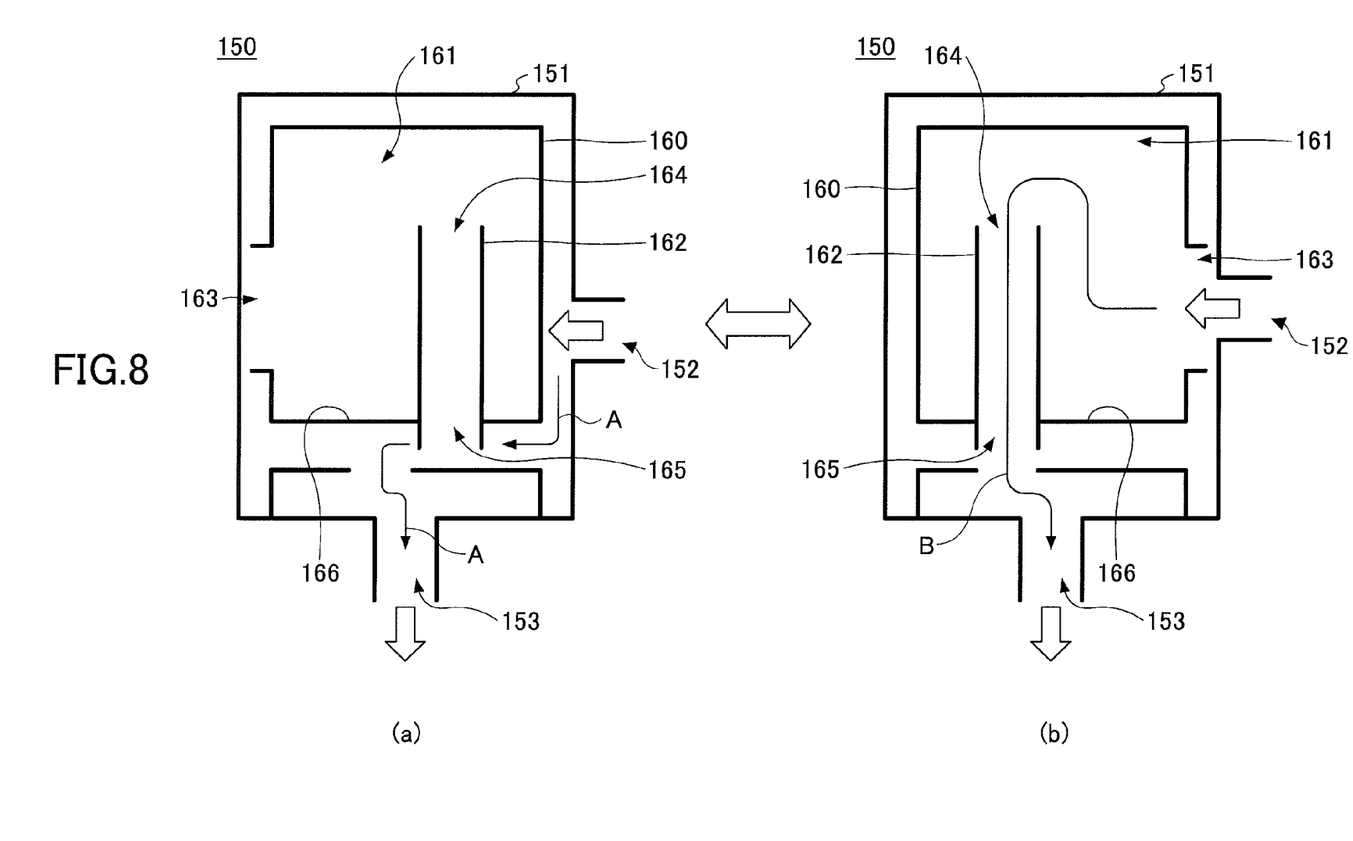
FIG. 8 is a view for explaining a function of a trap apparatus of a second embodiment.

Specifically, a second trap 150, which is a trap apparatus of the embodiment, is explained with reference to FIG. 8 to FIG. 10. The second trap 150 includes a cylindrical outer housing portion 151 and a cylindrical inner rotational portion 160 provided inside the outer housing portion 151. FIG. 8 is a view for explaining a function of the second trap 150, FIG. 9 is a view showing an inside structure of the second trap 150 which is at a bypass state, and FIG. 10 is a view showing an inside structure of the second trap 150 which is at a trapping state.

In the second trap 150, an inlet port 152 is provided at a side surface of the outer housing portion 151, and an exhausting port 153 is provided at a bottom surface of the outer housing portion 151. The inlet port 152 of the second trap 150 of the embodiment is connected to the exhausting port 34 of the first trap 30 of the first embodiment, and the exhausting port 153 is connected to the vacuum pump 70 of the first embodiment.

The inner rotational portion 160 is capable of being rotated in the outer housing portion 151, and the inner rotational portion 160 is provided with a space 161 and a tubular pipe 162 in its inside. Further, the inner rotational portion 160 is provided with an opening portion 163 for connecting the outside of the inner rotational portion 160 and the space 161 in the inner rotational portion 160. Thus, in the second trap 150, which is the trap apparatus of the embodiment, whether to match a position of the inlet port 152 of the outer housing portion 151 and a position of the opening portion 163 of the inner rotational portion 160 can be controlled by rotating the inner rotational portion 160. With this, whether to introduce the evacuated gasses into the space 161 in the inner rotational portion 160 can be controlled. The space 161 in the inner rotational portion 160 is cooled by a cooling unit, not shown in the drawings, to be a temperature at which the PMDA and ODA include in the gasses are solidified.

Figure 9:
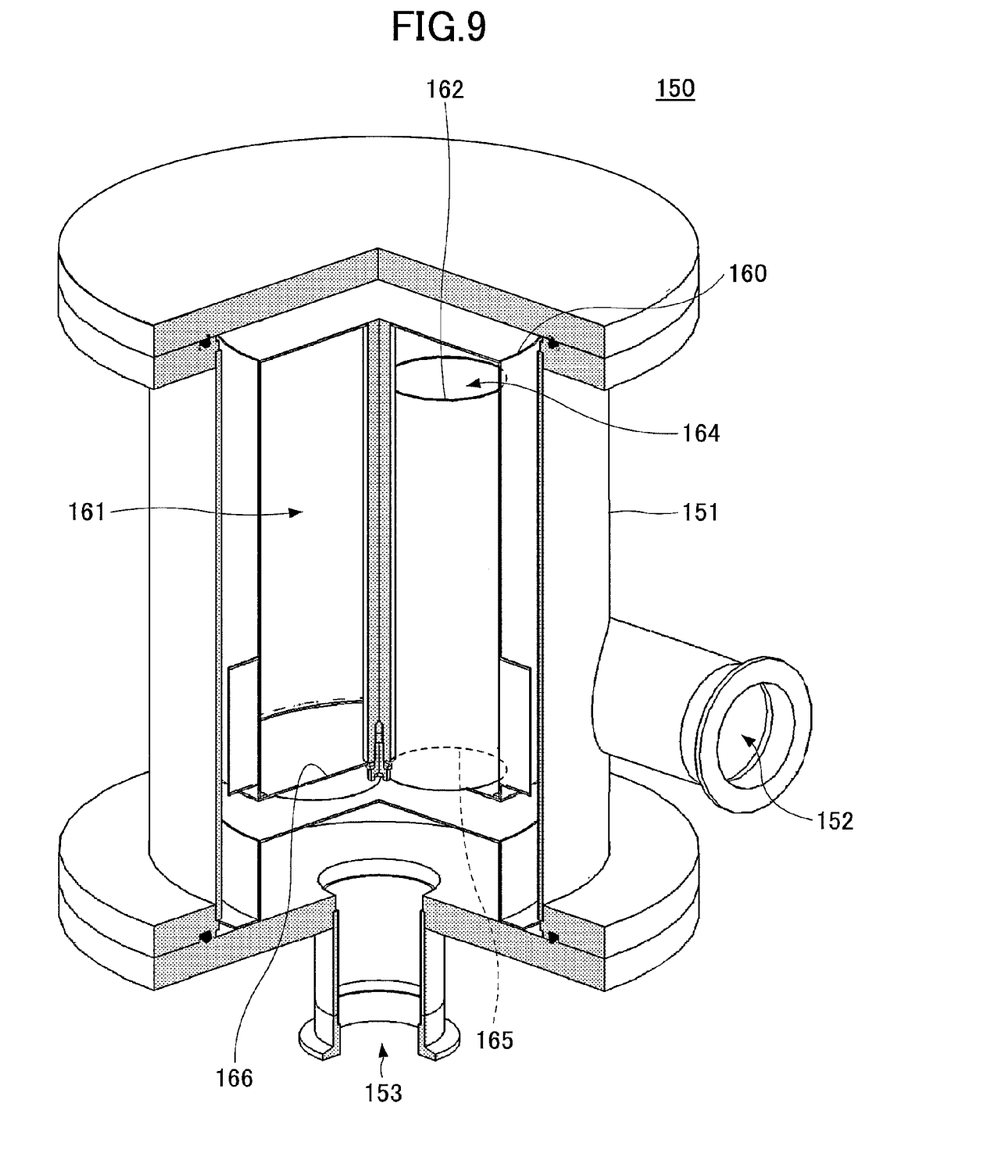
FIG. 9 is a view (1) showing a structure of the trap apparatus of the second embodiment.
Figure 10:
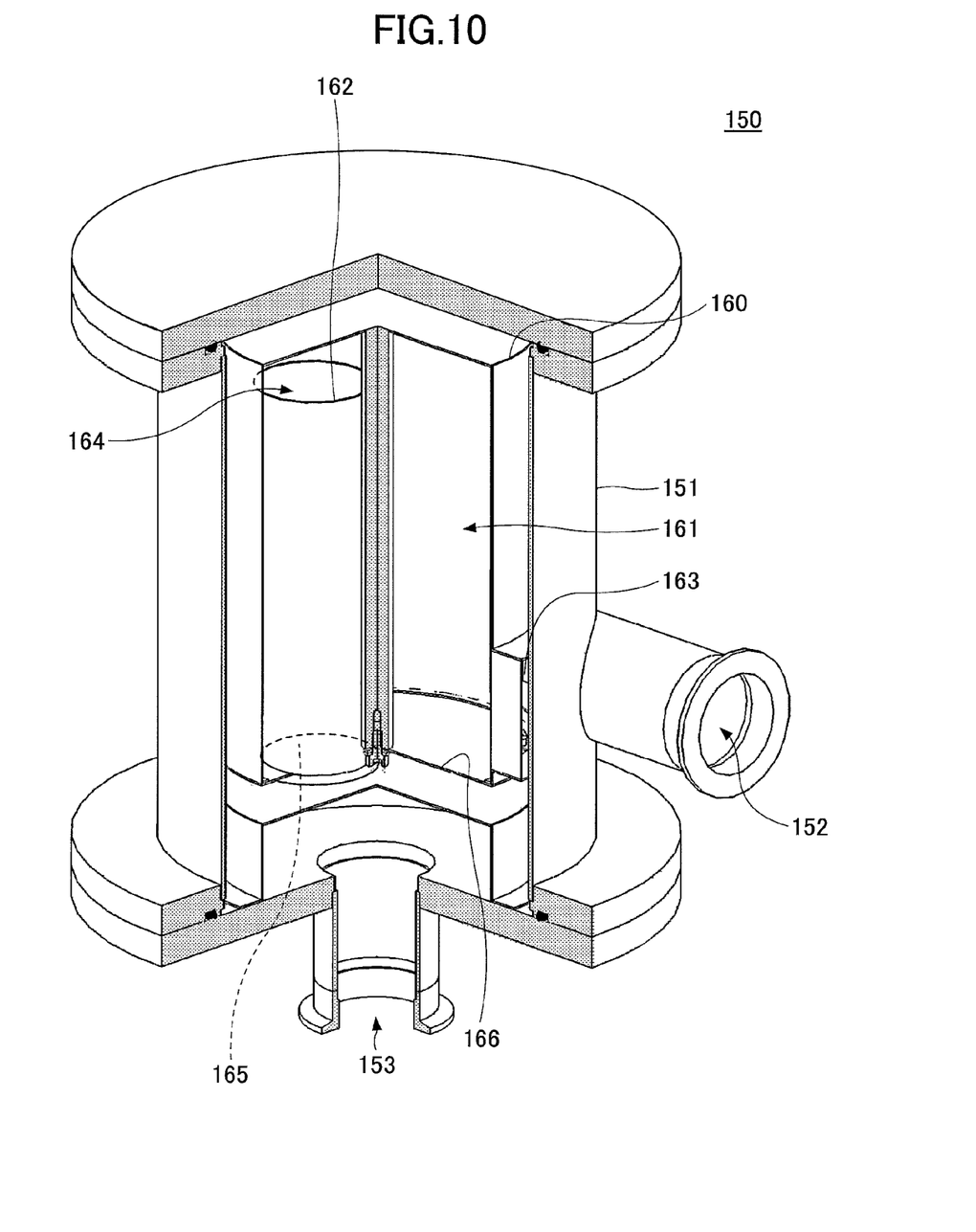
FIG. 10 is a view (2) showing a structure of the trap apparatus of the second embodiment.

Specifically, as shown in (a) of FIG. 8 and FIG. 9, when the position of the inlet port 152 of the outer housing portion 151 and the position of the opening portion 163 of the inner rotational portion 160 do not match, the gasses introduced from the inlet port 152 flow through a space between the outer housing portion 151 and the inner rotational portion 160, in other words, outside of the inner rotational portion 160 and inside of the outer housing portion 151, as shown by an arrow A and are exhausted from the exhausting port 153 without being introduced into the space 161 in the inner rotational portion 160. As the outer housing portion 151 is heated by a heater unit, not shown in the drawings, or the like, the vaporized materials included in the gasses flow from the inlet port 152 are exhausted from the exhausting port 153 without being solidified.

Next, as shown in (b) of FIG. 8 and FIG. 10, by rotating the inner rotational portion 160, when the position of the inlet port 152 of the outer housing portion 151 and the position of the opening portion 163 of the inner rotational portion 160 match, the gasses flow from the inlet port 152 are introduced into the space 161 in the inner rotational portion 160. The gasses introduced into the space 161 in the inner rotational portion 160 flow upward to an upper opening portion 164 of the tubular pipe 162, subsequently, flow in the tubular pipe 162, and are exhausted outside the inner rotational portion 160 from a lower opening portion 165 (an arrow B). The gasses exhausted outside the inner rotational portion 160 are subsequently exhausted outside the outer housing portion 151 from the exhausting port 153.

Here, as described above, the space 161 in the inner rotational portion 160 is cooled by the cooling unit, not shown in the drawings, the vaporized PMDA and ODA included in the gasses introduced into the space 161 are solidified, and fall by gravity to deposit on a bottom surface portion 166 in the space 161 as deposits, not shown in the drawings.

As described above, in the second trap 150 of the embodiment, by rotating the inner rotational portion 160, whether to cool the PMDA and ODA in a vaporized state included in the evacuated gasses and trap by falling by gravity settling can be controlled. In other words, a state where the evacuated gasses are bypassed, and a state where the evacuated gasses are flowed into the space 161 in the inner rotational portion 160 to remove the PMDA and ODA in a vaporized state can be changed over. Thus, the second trap 150, which is the trap apparatus of the embodiment, can be made small with low cost, and capable of changing over a trap function and a bypass function.

Further, as shown in FIG. 9 and FIG. 10, for the second trap 150, the inner rotational portion 160 may be manually rotated by a rotational lever, not shown in the drawings, which is provided outside the outer housing portion 151, or may be automatically rotated by providing a motor, not shown in the drawings, or the like and controlling the motor or the like.

The rest of the parts other than those explained above are the same as those of the first embodiment.

Third Embodiment

Next, third embodiment is explained. This embodiment relates to a trap apparatus having a different structure from that of the first embodiment and the second embodiment and the trap apparatus may be used as the second trap of the substrate processing apparatus of the first embodiment.

Figure 11:
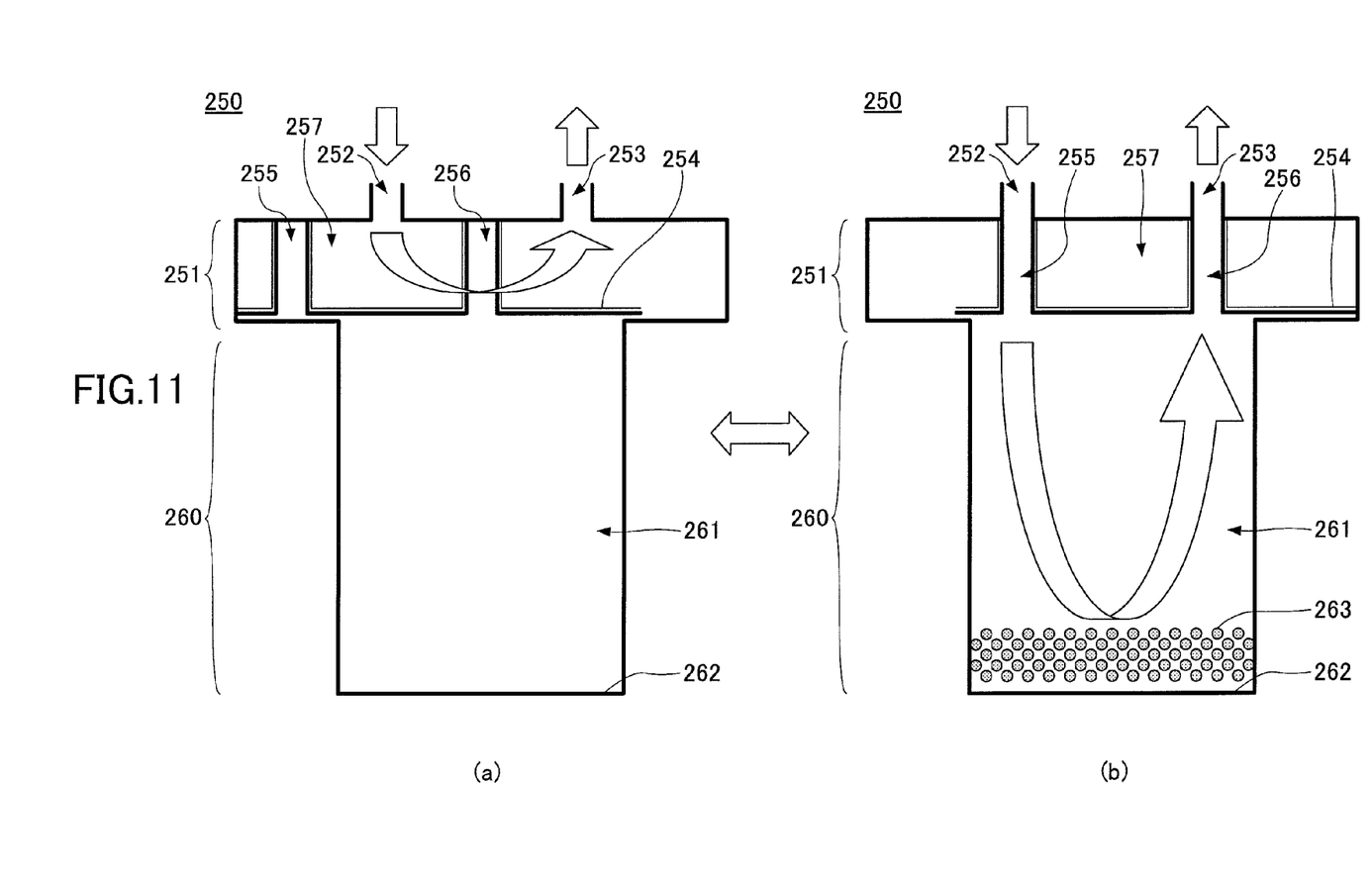
FIG. 11 is a view for explaining a function of a trap apparatus of a third embodiment.

Next, with reference to FIG. 11, a second trap 250, which is a trap apparatus of the embodiment, is explained. The second trap 250 includes a bypass portion 251 at an upper portion and a cooling trap portion 260 at a lower portion where the bypass portion 251 is slidably moved with respect to the cooling trap portion 260. FIG. 11 is a view for explaining a function of the second trap 250.

An inlet port 252 and an exhausting port 253 are provided at an upper surface of the second trap 250 where the inlet port 252 of the second trap 250 of the embodiment is connected to the exhausting port 34 of the first trap 30 of the first embodiment and the exhausting port 253 is connected to the vacuum pump 70 of the first embodiment.

A sliding unit 254 is provided at the bypass portion 251 at the upper portion of the second trap 250, and a first channel 255 and a second channel 256 for being connected to the inside of the cooling trap portion 260 are provided to the sliding unit 254. The bypass portion 251 is provided with a space 257 at an area other than the areas where the first channel 255 and the second channel 256 are provided.

Further, the cooling trap portion 260 is provided with a space 261 at its inside which is connected to the inlet port 252 and the exhausting port 253 via the first channel 255 and the second channel 256, respectively, when the sliding unit 254 of the bypass portion 251 relatively slides.

Further, a heater unit, not shown in the drawings, is provided at the bypass portion 251 and the entirety of the bypass portion 251 is heated. Further, a cooling unit, not shown in the drawings, is provided at the cooling trap portion 260, and the entirety of the space 261 in the cooling trap portion 260 is cooled.

In the second trap 250 of the embodiment, whether to introduce the evacuated gasses into the space 261 in the cooling trap portion 260 can be controlled by whether to connect the first channel 255 and the second channel 256 to the inlet port 252 and the exhausting port 253, respectively, by sliding the sliding unit 254 of the bypass portion 251.

Specifically, as shown in (a) of FIG. 11, when the first channel 255 and the second channel 256 are not connected to the inlet port 252 and the exhausting port 253, respectively, the gasses flow from the inlet port 252 are introduced into the space 257 in the bypass portion 251 and exhausted from the exhausting port 253. As the bypass portion 251 is heated by the heater unit, not shown in the drawings, the vaporized materials included in the gasses introduced into the space 257 in the bypass portion 251 are not solidified and the gasses introduced from the inlet port 252 are exhausted from the exhausting port 253 as they are.

Next, as shown in (b) of FIG. 11, when the first channel 255 and the second channel 256 are connected to the inlet port 252 and the exhausting port 253, respectively, by sliding the sliding unit 254 of the bypass portion 251, the gasses flow from the inlet port 252 are introduced into the space 261 in the cooling trap portion 260 via the first channel 255, and subsequently, are exhausted from the exhausting port 253 via the second channel 256. The cooling unit, not shown in the drawings, is provided in the cooling trap portion 260, and the entirety of the space 261 in the cooling trap portion 260 is cooled so that the PMDA and ODA in a vaporized state included in the gasses introduced into the space 261 are solidified, fall by gravity and deposit on a bottom surface portion 262 in the space 261 in the cooling trap portion 260 as deposits 263.

The rest of the parts other than those explained above are the same as those of the first embodiment.

The present invention is not limited to the specifically disclosed embodiments, and variations and modifications may be made without departing from the scope of the present invention.

The present application is based on Japanese Priority Application No. 2010-148013 filed on Jun. 29, 2010, the entire contents of which are hereby incorporated by reference.

What is claimed is:

1. A trap apparatus provided between a chamber to which a gas supply unit for introducing gas to process a substrate is connected and an evacuating unit for evacuating the gas in the chamber, comprising:

a housing provided with an inlet port to be connected to the chamber, and an exhausting port to be connected to the evacuating unit;

a cooling trap portion provided in the housing, provided with a first space and configured to cool gas introduced into the first space to be a temperature lower than a temperature at which an unreacted component included in the gas is solidified; and a rotational portion provided in the housing and including a first channel capable of communicating between the inlet port and the first space, and a second channel capable of communicating between the first space and the exhausting port, the rotational portion being configured to form a bypass portion provided with a second space capable of communicating between the inlet port and the exhausting port by separating a space in the housing into the first space and the second space, the rotational portion being configured to rotate with respect to the housing so that the first channel, the second channel and the second space rotate with respect to the first space of the cooling trap portion to selectively form
- a first path from the inlet port to the exhausting port via the first channel, the first space and the second channel, and
- a second path from the inlet port to the exhausting port via the second space.

2. The trap apparatus according to claim 1, wherein the bypass portion and the cooling trap portion are placed in this order along a path of gravity.

3. The trap apparatus according to claim 1, further comprising:
a heater unit that heats the bypass portion to be a temperature higher than a temperature at which an unreacted component included in the gas is solidified.

4. The trap apparatus according to claim 1, wherein the gas includes one of or both of PMDA and ODA.

5. The trap apparatus according to claim 4, wherein the temperature of the cooling trap portion is set to be less than or equal to 120° C.

6. A substrate processing apparatus comprising:
a chamber for processing a substrate;
a gas supply unit for introducing gas into the chamber;
an evacuating unit for evacuating the gas in the chamber; and
the trap apparatus according to claim 1 provided between the chamber and the evacuating unit.

7. The substrate processing apparatus according to claim 6, further comprising:
another trap apparatus provided between the chamber and the trap apparatus for removing an unreacted component included in the gas by reacting the unreacted component to form polymer.

8. The substrate processing apparatus according to claim 7, wherein a temperature of the other trap apparatus is set to be 140 to 200° C.

9. The trap apparatus according to claim 1, wherein the rotational portion is configured to form
the first path by matching the position of the first channel with the position of the inlet port, and
the second path by blocking the communication between the first channel with the inlet port by the housing.

10. The trap apparatus according to claim 1, wherein the rotational portion is configured to form
the first path by matching the positions of the first channel and the second channel with the positions of the inlet port and the exhausting port, respectively, and
the second path by blocking the communication between the first channel and the second channel with the inlet port and the exhausting port, respectively, by the housing.

11. The trap apparatus according to claim 1, wherein the first space is formed in the rotational portion and the second space is formed between the rotational portion and the housing.

12. The trap apparatus according to claim 2, wherein the inlet port and the exhausting port are formed at an upper surface of the housing.

* * * * *